(12) United States Patent
Mehta et al.

(10) Patent No.: US 7,197,438 B1
(45) Date of Patent: Mar. 27, 2007

(54) SYSTEM AND METHOD FOR MEMORY COMPILER CHARACTERIZATION

(75) Inventors: Deepak Mehta, Raritan, NJ (US);
Andrew Knight, Piscataway, NJ (US);
Deepak Sabharwal, Fremont, CA (US);
Raymond Tak-Hoi, Palo Alto, CA (US)

(73) Assignee: Virage Logic Corp., Fremont, CA (US)

(*) Notice: Subject to any disclaimer, the term of this patent is extended or adjusted under 35 U.S.C. 154(b) by 795 days.

(21) Appl. No.: 09/981,954

(22) Filed: Oct. 18, 2001

(51) Int. Cl.
*G06F 17/10* (2006.01)

(52) U.S. Cl. ............................ 703/2; 703/14; 703/24; 703/21; 716/5; 716/1; 365/191; 365/194; 365/200

(58) Field of Classification Search ................ 703/24, 703/25, 13, 2, 14; 716/5, 1; 365/230.06, 365/200, 191, 194
See application file for complete search history.

(56) References Cited

U.S. PATENT DOCUMENTS

| | | | | |
|---|---|---|---|---|
| 5,175,707 A | * | 12/1992 | Murotani | ............... 365/230.06 |
| 5,970,240 A | * | 10/1999 | Chen et al. | .................... 703/25 |
| 6,249,901 B1 | * | 6/2001 | Yuan et al. | ..................... 716/5 |
| 6,282,131 B1 | * | 8/2001 | Roy | ............................ 365/191 |
| 6,356,503 B1 | * | 3/2002 | Roy | ....................... 365/230.06 |
| 6,363,020 B1 | * | 3/2002 | Shubat et al. | ................ 365/200 |
| 6,405,160 B1 | * | 6/2002 | Djaja et al. | .................... 703/24 |
| 6,538,932 B1 | * | 3/2003 | Ellis et al. | .................. 365/194 |
| 6,738,953 B1 | * | 5/2004 | Sabharwal et al. | ............ 716/1 |

OTHER PUBLICATIONS

Lim et al., A widely configurable EPROM memory compiler for embedded applications, IEEE, 1998.*
Gee et al., "A diffused CMOS SRAM compiler for gate arrays", IEEE 1991.*
Zhang et al., "A multi-magabit memory compiler: Tomorrow's IP", IEEE 1999.*

* cited by examiner

*Primary Examiner*—Kandasamy Thangavelu
(74) *Attorney, Agent, or Firm*—Danamraj & Youst, P.C.

(57) ABSTRACT

A memory compiler characterization system and method for determining parametric data, wherein memory compilers of a first type are rigorously characterized and memory compilers of a second type are sparsely characterized with respect to a particular parameter. Absolute scale factors are determined based on the ratio of the parametric data points of two congruent memory compilers, one from each type. Interpolated scale factors are obtained based on the absolute scale factors. Parametric data for the remaining compilers of the sparsely characterized compiler set is filled out by applying the interpolated scale factors in conjunction with the data of the congruent memory compilers of the first type.

33 Claims, 4 Drawing Sheets

SYSTEM AND METHOD FOR MEMORY COMPILER CHARACTERIZATION

INCORPORATION BY REFERENCE TO RELATED APPLICATION(S)

This application discloses subject matter related to the subject matter disclosed in the following commonly owned co-pending U.S. patent application(s): (i) "Self-Timed Clock Circuitry In A Multi-Bank Memory Instance Using A Common Timing Synchronization Node," filed Sep. 27, 2000, Ser. No. 09/671,456, in the name(s) of: Richard S. Roy, which is/are hereby incorporated by reference for all purposes.

BACKGROUND OF THE INVENTION

1. Technical Field of the Invention

The present invention relates generally to semiconductor memories, and more particularly, to a system and method for efficiently characterizing memory compilers.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that various types of circuitry such as analog blocks, non-volatile memory (e.g., read-only memory or ROM), random access memories (RAMs), and other "non-logic" cells are being required. The gap in available silicon capacity versus design productivity means that without some fundamental change in methodology, it will take several staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. It is also well known that various parameters such as delay, access time, cycle time, etc., are significant factors in designing a high performance memory instance, whether provided as a stand-alone device or in an embedded application. In order to ensure that a compilable memory circuit operates in accordance with its performance specifications, the memory compiler used for compiling the memory instance is typically required to be thoroughly characterized in terms of the various parameters of interest. Typically, timing parameters such as cycle time ($t_{cc}$), clock-to-Q delay or access time ($t_{cq}$), et cetera, are extensively simulated for a memory compiler during its design phase.

The high-density memory compilers of today are operable to compile memory instances of various aspect ratios (i.e., height and width of the floor plan of a memory array having a select number of physical rows and a select number of physical columns, which are organized using a particular column multiplex (MUX) factor). Accordingly, when a family of compilers designed for memory instances having a variable number of rows or columns need be characterized, each particular compiler that corresponds to an instance needs to be characterized with respect to several key parameters.

As is well known, the high-density compilers are typically comprised of multiple clusters (depending on leaf cell hierarchy) that represent circuit/area optimization schemes for a combination of words, bits per word (BPW), and MUX factors, which ultimately translates into certain rows and columns. The array of data bits can range vastly, for example, rows and columns each ranging from 8 to 1024. A memory compiler is associated with each instance of a particular row/column combination and all such memory compilers within a compiler family need to be characterized to obtain relevant parametric data, for example, timing data which is encapsulated in a timing estimator. It should be appreciated by those skilled in the art that the task of creating parametric datasets large enough to cover the entire applicable range of compilers is very processor-intensive, requiring tens of hundreds of hours in CPU time.

Furthermore, parametric data thus obtained must satisfy stringent levels of accuracy. That is, the memory compilers' parametric data generated via characterization must be within a narrow range of the actual data obtained for the corresponding memory instances. Typically, it is expected that the memory compilers' parametric data should be within 2–3% of the actual data in order to be satisfactory.

State-of-the-art solutions relating to memory compiler characterization typically involve simulation of an extensive number of memory compilers to obtain data points with respect to a particular parameter of interest. An estimator is used subsequently to estimate the data for the remaining memory compilers of a compiler family. Although such techniques have been widely implemented, they are not efficient in general. For example, a huge number of memory compilers still need to be characterized in order that the estimated data is within a specified error rate of 2–3%. As a consequence, large amounts of processor time and engineering resources continue to be required for adequately characterizing the state-of-the-art memory compilers.

In addition, where migration to a different family of compilers is necessitated due, for example, to a change in the MUX factor, adaptation of a different technology, et cetera, an entirely new set of memory compilers needs to be characterized to the same exacting standards again. Clearly, the requirement to create large enough datasets necessary for adequate characterization each time simply compounds the deficiency of the existing solutions.

SUMMARY OF THE INVENTION

Accordingly, the present invention is directed to an efficient memory compiler characterization system and method for determining parametric data which advantageously overcomes these and other deficiencies of the state-of-the-art solutions. Memory compilers of a first type (i.e., having a first MUX factor, or being operable with a source technology, et cetera) are relatively extensively sampled for simulation with respect to a particular parameter in order to give rise to a rigorously characterized parametric dataset. Memory compilers of a second type (i.e., having a second MUX factor, or being operable with a target technology, etc.) are coarsely sampled such that a sparsely characterized dataset is obtained with respect to same parameter. The memory compilers of the second type are matched with the memory compilers of the first type (i.e., congruent), in that a compiler of the second type operable to compile a memory instance of i rows and j columns has a corresponding compiler of the first type with the same row and column combination.

Absolute scale factors are determined based on the ratio of the parametric data points of two congruent memory compilers, one from each type. Thereafter, interpolated scale factors are obtained based on the absolute scale factors, preferably by using a 4-point interpolation technique. Parametric data for the remaining compilers of the sparsely characterized compiler set is filled out by applying the interpolated scale factors in conjunction with the data of the congruent memory compilers of the first type.

In a further aspect, the present invention is directed to a computer-accessible medium operable in connection with a processor environment, wherein the computer-accessible medium carries a sequence of instructions which, when executed in the processor environment, cause the various steps involved in the memory compiler characterization scheme of the present invention as summarized hereinabove.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
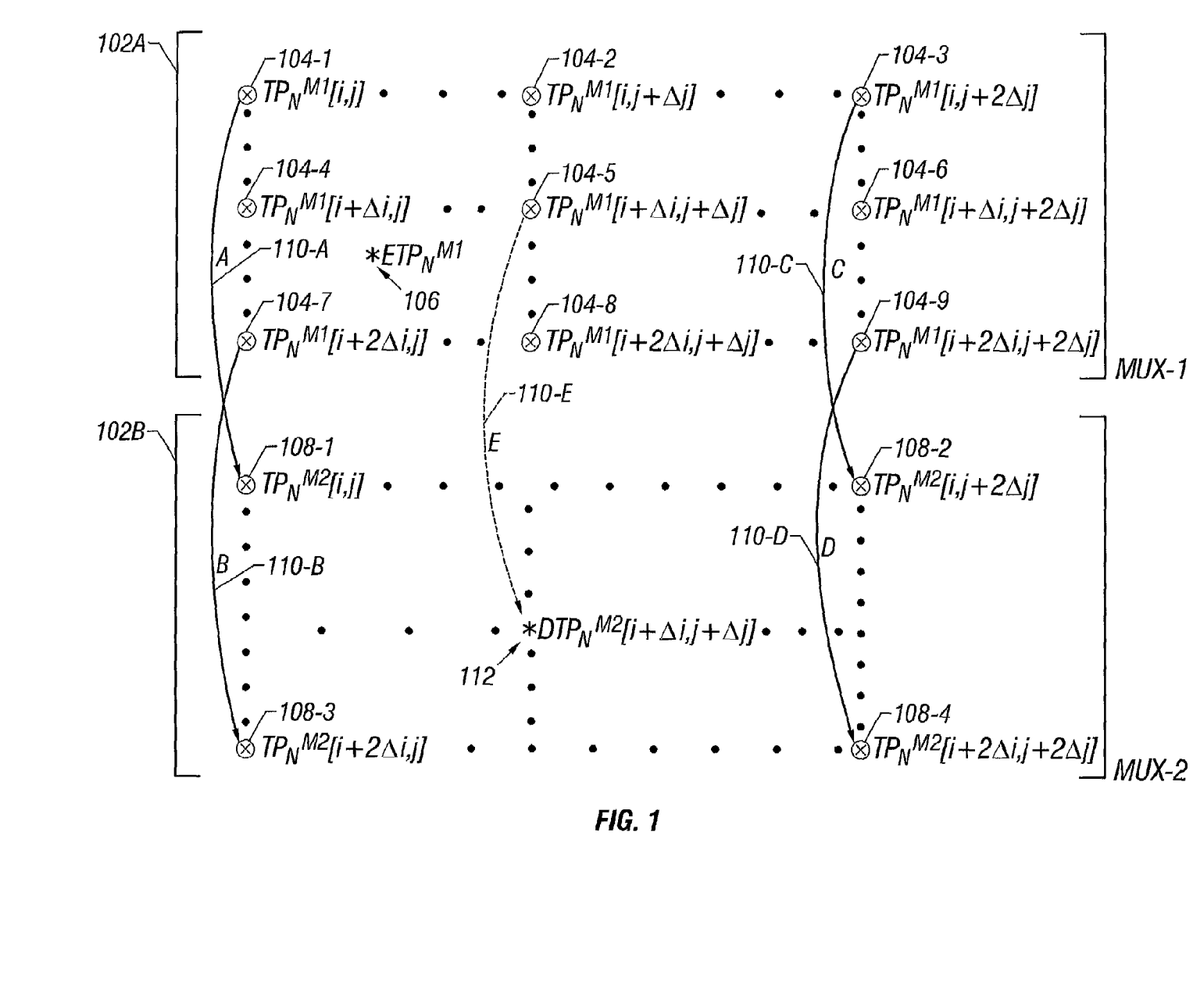
FIG. 1 depicts a first exemplary embodiment of a memory compiler characterization scheme in accordance with the teachings of the present invention.

In the drawings, like or similar elements are designated with identical reference numerals throughout the several views thereof, and the various elements depicted are not necessarily drawn to scale. Referring now to FIG. 1, depicted therein is a first exemplary embodiment of a memory compiler characterization scheme provided in accordance with the teachings of the present invention, wherein parametric data (e.g., timing data such as cycle time, access time, etc.) can be efficiently generated for a number of high-density memory compilers such that the accuracy of the parametric estimators is within certain acceptable bounds. At the outset, it should be recognized by those skilled in the art that the teachings of the present invention may be advantageously utilized for memory compilers operable to compile instances comprising any memory type such as, e.g., dynamic random access memory (DRAM), static random access memory (SRAM), read-only memory (ROM), erasable programmable ROM (EPROM), flash memory, and the like. Moreover, the memory instances may be provided as embedded memory circuits or as stand-alone memory devices.

As alluded to hereinabove, a typical memory instance comprises a memory array (also referred to as a bitcell array) formed of a plurality of bitcells and organized in known manner based on three design features: number of words, number of BPW, and column MUX factor. The number of physical rows and physical columns relating to the floor plan of such a memory array can be determined based on the following relationships: number of columns=BPW×MUX factor; and number of rows=(number of words)/MUX factor. A row decoder (X-DEC), a control block, and a column MUX and I/O block, are also provided in known manner for effectuating the functionality of the memory instance. Moreover, the physical architecture of the memory instance may include any hitherto known or unknown design variations. Thus, for instance, the memory instance can also comprise a memory array with a plurality of banks, divided wordlines, redundancy and reference bitline/wordline portions, centrally-placed row decoders, and/or a variable number of I/Os with applicable column MUXing schemes. Additional details regarding the physical architecture of an exemplary memory instance may be found in the following commonly owned co-pending U.S. patent application: "Self-Timed Clock Circuitry In A Multi-Bank Memory Instance Using A Common Timing Synchronization Node," filed Sep. 27, 2000, Ser. No. 09/671,456, in the name(s) of: Richard S. Roy, which is hereby incorporated by reference.

It should be apparent that for each combination of rows and columns, there can exist several column MUX options, and a particular combination of words, BPW and MUX factor can be used to realize the same number of physical rows and columns, wherein the combination is dictated by the MUX factor. For example, consider a memory instance with 2048 words and 32 BPW, and organized with a MUX factor of 8. Based on the relationships set forth above, the number of physical columns in this case is: 8×32=256 columns. The number of physical rows, similarly, works out to be 2048/8=256 rows. Now consider another memory instance having 1024 words and 64 BPW, and organized with a MUX factor of 4. In this case, the number of columns is: 4×64=256, and the number of rows is: 1024/4=256.

It should be appreciated by those skilled in the art upon reference hereto that it is advantageous to view compiler characterization data (i.e., parametric data associated with the memory instances that can be compiled by respective compilers) as dependent on a number of factors, four of which are relevant for purposes of the present patent application. These factors are: (i) number of rows, (ii) number of columns, (iii) MUX factor, and (iv) memory technology. In the context of the present invention, memory technology may encompass foundries where the memories are to be fabricated, process flows used for memory fabrication, line widths or feature geometries such as, e.g., ranging from 1.2µ down to 0.15µ, and the like.

The present invention posits that whereas the timing parametric data is dependent on the rows and columns of a memory instance, such data is relatively independent of the MUX factor or the memory technology used. This is based on the observation that the parametric data (i.e., timing parameter values) is primarily driven by the load on the bitlines, wordlines and final address decode circuitry. Further, the loading on the bitlines and the address decode is in turn dependent on the number of physical rows of the memory instance. Similarly, the wordline loading is dependent on physical columns of the memory instance. Accordingly, a "parametric mapping" may be constructed in accordance with the teachings of the present invention for characterizing a plurality of memory compilers based on a particular variant/type of "independent" factor (e.g., MUX factor, memory technology, and so on), once the characterization data is obtained for a relatively extensive set of compilers having another variant of the same independent factor. As will be shown in greater detail hereinbelow, such a parametric mapping technique advantageously provides an efficient memory compiler characterization scheme that overcomes the deficiencies of the state-of-the-art solutions set forth in the Background section of the present patent application.

Continuing to refer to FIG. 1, reference numeral 102A refers to a rigorously characterized first parametric dataset wherein an extensive set of memory compilers are simulated with respect to a particular parameter. Each memory compiler is operable to compile a memory instance having a select number of physical rows and a select number of physical columns. For example, the number of rows may vary from 8 to 1024. Similarly, the number of columns may vary from 8 to 1024. Thus, the universe of memory compilers for which the first parametric dataset 102A is obtained may range, by way of the example set forth above, from a memory compiler for compiling an instance having 8 rows and 8 columns to a memory compiler for compiling an instance having 1024 rows and 1024 columns.

Further, the memory compilers associated with the first parametric dataset 102A are all operable to compile memory instances having the same MUX factor, e.g., MUX factor of 4, 8, 16, and the like. That is, each memory instance is organized with the same MUX factor regardless of the number of physical rows and physical columns. For purposes of the present patent application, we may designate the MUX factor associated with the memory compilers of the first dataset as MUX-1.

As alluded to hereinabove, the first parametric dataset 102A comprises a dataset that is rigorously characterized, that is, a particular parameter of interest (e.g., a specific timing parameter or $TP_N$, where N ranges from 1 to a predetermined number) is actually simulated for a relatively large number of the memory compilers. Of the entire universe of memory compilers with MUX-1, a sample of compilers are thus characterized, thereby giving rise to a corresponding number of data points in the dataset 102A. Reference numerals 104-1 through 104-9 refer to nine such data points, wherein each data point is a value obtained for a specific memory compiler with respect to the particular timing parameter ($TP_N$). For example, reference numeral 104-1 refers to the parametric value $TP_N^{M1}[i, j]$ that is obtained for a compiler operable to compile a memory instance of i rows and j columns and organized using MUX-1. Similarly, $TP_N^{M1}[i+\Delta i, j]$ and $TP_N^{M1}[i+2\Delta i, j]$ denote two parametric values for memory instances having arrays of $[i+\Delta i, j]$ and $[i+2\Delta i, j]$, respectively, wherein the number of columns is kept the same while the number of rows is incremented by $\Delta i$ and $2\Delta i$. Also, the number of columns may be incremented while the number of rows is kept constant. Where both i and j are incremented, at the other extreme, $TP_N^{M1}[i+2\Delta i, j+2\Delta j]$ denotes the parametric value obtained for the compiler having $[i+2\Delta i]$ rows and $[j+2\Delta j]$ columns. In FIG. 1, the actual simulated parametric data points obtained for the sampled MUX-1 compilers are denoted by a ⓧ symbol.

Preferably, the compilers are selected for rigorous characterization such that the parametric value for a MUX-1 compiler that is not sampled may be estimated by an estimator using a select number of actual data points obtained for the MUX-1 compilers that surround the non-sampled MUX-1 compiler. In the exemplary embodiment shown in FIG. 1, reference numeral 106 refers to an estimated timing parameter $ETP_N^{M1}$ for a compiler whose array size is bounded by $[i+\Delta i, j]$, $[i+2\Delta i, j]$, $[i+\Delta i, j+\Delta j]$ and $[i+2\Delta i, j+\Delta j]$, which estimated timing parameter is based on the actual simulated data points 104-4, 104-5, 104-7, 104-8.

Reference numeral 102B refers to a second parametric dataset pertaining to memory compilers operable to compile memory instances having a second MUX factor (MUX-2), e.g., MUX factor of 4, 8, 16, 32, et cetera. In accordance with the teachings of the present invention, the second parametric dataset 102B is relatively sparsely characterized, in that a small number out of the possible memory clusters of MUX-2 are selected for characterization via, e.g., simulation, with respect to the same parameter ($TP_N$) that has been characterized for the MUX-1 memory compilers. Further, each MUX-2 memory compiler, which is operable for compiling a respective memory instance organized with the MUX-2 factor, is preferably sampled such that a memory instance compiled by its MUX-2 compiler corresponds to a respective congruent memory instance of the first parametric dataset 102A that is comprised of the same numbers of physical rows and physical columns. In other words, if a MUX-2 memory instance sampled for actual simulation comprises i rows and j columns, there is a corresponding memory instance in the first parametric dataset 102A that is actually simulated with respect to the parameter of interest that also has i rows and j columns but organized with MUX-1 factor. Such memory instances may be conveniently referred to as a congruent memory instance pair. Also, the corresponding compilers may analogously be referred to as a congruent compiler pair.

The second parametric dataset 102B is comprised of a dataset that is relatively sparsely populated initially, wherein the data points correspond to the actual simulated parametric values of MUX-2 memory compilers that are congruent with a select number of MUX-1 compilers. However, only a small subset of the entire universe of possible congruent memory instances (thus, the memory compilers) need to be sampled for purposes of the present invention (i.e., coarse sampling). Reference numerals 108-1 through 108-4 refer to four data points comprising actual parametric data for four congruent MUX-2 compilers. In particular, $TP_N^{M2}[i, j]$ (reference numeral 108-1) denotes the parametric data ($TP_N$) obtained for a memory instance having i rows and j columns and organized with MUX-2 factor, which corresponds to its congruent instance associated with data point 104-1 in the first parametric dataset 102A. Similarly, memory instances $M2[i+2\Delta i, j]$, $M2[i, j+2\Delta j]$, and $M2[i+2\Delta i, j+2\Delta j]$ used for populating the second parametric dataset 102B, which are respectively congruent with instances $M1[i+2\Delta i, j]$, $M1[i, j+2\Delta j]$, and $M1[i+2\Delta i, j+2\Delta j]$ of the first parametric dataset 102A, give rise to data points $TP_N^{M2}[i+2\Delta i, j]$ (reference numeral 108-3), $TP_N^{M2}[i, j+2\Delta j]$ (reference numeral 108-2), and $TP_N^{M2}[i+2\Delta i, j+2\Delta j]$ (reference numeral 108-4), respectively.

In accordance with the teachings of the present invention, parametric scale factors are determined with respect to a select number of data points associated with respective congruent memory instances of the first and second datasets 102A, 102B. Preferably, the scale factors are determined as ratios of the parametric data corresponding to a congruent memory compiler pair. In the exemplary embodiment of the present invention shown in FIG. 1, reference numerals 110-A through 110-D diagrammatically illustrate four scale factor relationships A–D, respectively, which are obtained as ratios of the four respective pairs of data points. Specifically, scale factor A is determined as the ratio between $TP_N^{M1}[i, j]$ and $TP_N^{M2}[i, j]$, which correspond to the congruent pair M1[i, j] and M2[i, j]. In similar fashion, scale factor B is the ratio between data points $TP_N^{M1}[i+2\Delta i, j]$ and $TP_N^{M2}[i+2\Delta i, j]$, scale factor C is the ratio between data points $TP_N^{M1}[i, j+2\Delta j]$ and $TP_N^{M2}[i, j+2\Delta j]$, and scale factor D is the ratio between data points $TP_N^{M1}[i+2\Delta i, j+2\Delta j]$ and $TP_N^{M2}[i+2\Delta i, j+2\Delta j]$.

An interpolated parametric scale factor, reference numeral 110-E, may be obtained by interpolating a plurality of absolute ratios such as the scale factors A–D above. Preferably, a 4-point interpolation technique may be utilized for this purpose. Thereafter, the sparsely sampled parametric dataset 102B is populated by deriving or estimating the parametric values for additional MUX-2 memory compilers, wherein the interpolated scale factor is applied to the data points of the first parametric dataset 102A on a congruent pair basis. For example, the parametric data for a compiler operable to compile the memory instance M2[i+Δi, j+Δj] is derived by multiplying the parametric data $TP_N^{M1}[i+\Delta i, j+\Delta j]$ (of the congruent instance M1[i+Δi, j+Δj]) with the interpolated scale factor E. Reference numeral 112 refers to the derived data point $DTP_N^{M2}[i+\Delta i, j+\Delta j]$ based on the application of E in conjunction with the data point associated with the congruent instance M1[i+Δi, j+Δj]. It should be apparent that the same interpolated parametric scale factor E may be used for deriving parametric data for all compilers bounded in the region defined by [i, j], [i, j+2Δj], [i+2Δi, j] and [i+2Δi, j+2Δj]. Another set of absolute ratios (A', B', C', and D') may be obtained for congruent memory instances outside this region, which ratios may be used for interpolating another estimated scale factor E'. This new estimated scale factor E' can then be used for deriving the parametric data for the MUX-2 compilers in that congruent region. As another variation, those skilled in the art should appreciate that the regions bounded by [i, j], [i, j+2Δj], [i+2Δi, j], and [i+2Δi, j+2Δj] (corresponding to scale factors A, B, C, and D) and by [i, j]', [i, j+2Δj]', [i+2Δi, j]' and [i+2Δi, j+2Δj]' (corresponding to scale factors A', B', C', and D') may also be allowed to overlap to a predetermined degree.

Favorable results have been obtained by coarse sampling of the MUX-2 memory compilers and populating the remainder of the dataset with derived data values that are obtained using the interpolated scale factors in conjunction with a rigorously characterized dataset (i.e., MUX-1 dataset). Satisfactory rates of accuracy have been validated by experimentation and extensive simulation, wherein the derived values are within 2–3% of the simulated data. Further, the total number of data points needed to achieve such accuracy levels has been found to be significantly reduced, thereby giving rise to a substantial savings in terms of processor time and related engineering resources.

Figure 2:
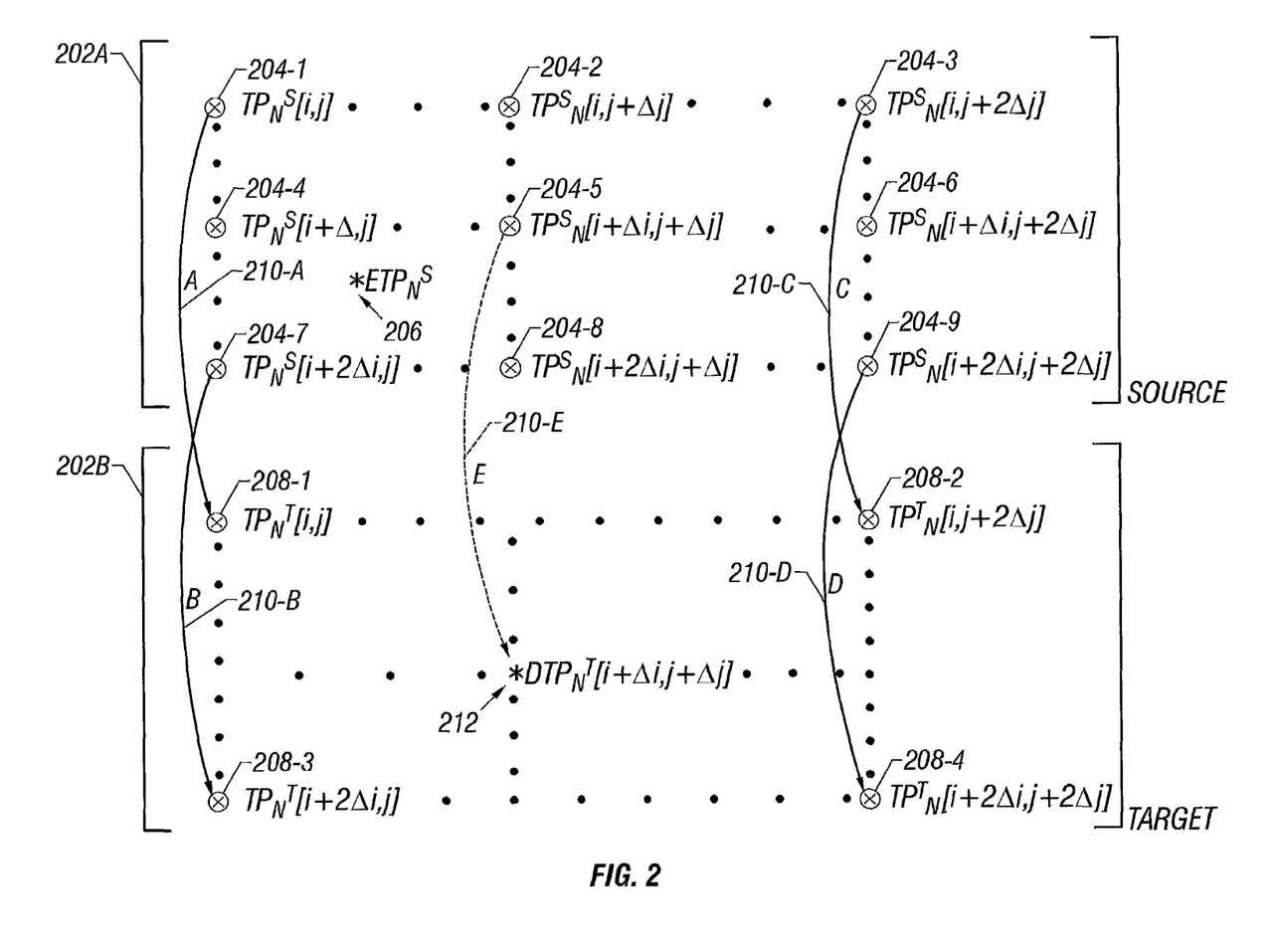
FIG. 2 depicts a second exemplary embodiment of the memory compiler characterization scheme in accordance with the teachings of the present invention.

FIG. 2 depicts a second exemplary embodiment of the memory compiler characterization scheme in accordance with the teachings of the present invention, wherein parametric data from memory clusters of one memory technology variant is scaled or mapped to another parametric dataset for memory clusters of a second memory technology variant. As will be readily recognized by those skilled in the art upon reference hereto that the second exemplary embodiment of the memory compiler characterization scheme is similar to the exemplary characterization scheme described in detail hereinabove, only the salient features of the second embodiment are set forth hereinbelow.

Reference numeral 202A refers to a first parametric dataset comprising a rigorously characterized dataset wherein a relatively extensive number of memory compilers are simulated. Once again, each memory compiler is operable to compile a memory instance having a select number of physical rows and columns which are organized using a select MUX factor. Further, the memory compilers associated with the first parametric dataset 202A are operable with a particular memory technology, e.g., foundry, process flow, feature size, and the like. For the sake of convenience, the particular technology variant associated with the first parametric dataset 202A may be referred to as "source" technology.

Of the entire universe of memory compilers operable with the source technology, only a sample of compilers are characterized, thereby giving rise to a corresponding number of data points in the dataset 202A. Reference numerals 204-1 through 204-9 refer to nine such data points, wherein each data point is a value actually simulated for a specific memory compiler with respect to the particular timing parameter ($TP_N$). Similar to the first exemplary embodiment, reference numeral 204-1 refers to the parametric value $TP_N^S[i, j]$ that is obtained for a compiler operable to compile a memory instance of i rows and j columns using the source technology. By extension, data points $TP_N^S[i+\Delta i, j]$, $TP_N^S[i+2\Delta i, j]$, $TP_N^S[i, j+\Delta j]$, $TP_N^S[i+\Delta i, j+\Delta j]$, $TP_N^S[i+2\Delta i, j+\Delta j]$, $TP_N^S[i, j+2\Delta j]$, $TP_N^S[i+\Delta i, j+2\Delta j]$, and $TP_N^S[i+2\Delta i, j+2\Delta j]$ are also obtained, which are denoted by a ⊗ symbol. Parametric data for other compilers not sampled may be estimated by an estimator using a select number of actual data points. In the exemplary embodiment shown in FIG. 2, reference numeral 206 refers to an estimated timing parameter $ETP_N^S$ for a compiler whose array size is bounded by [i+Δi, j], [i+2Δi, j], [i+Δi, j+Δj] and [i+2Δi, j+Δj], which estimated timing parameter is based on the actual data points 204-4, 204-5, 204-7, 204-8.

Reference numeral 202B refers to a second parametric dataset pertaining to memory compilers operable to compile memory instances in a second or "target" technology having the same select MUX factor. In accordance with the teachings of the present invention, the second parametric dataset 202B is relatively sparsely characterized, wherein the characterized memory compilers are sampled to be congruent with respective compilers of the source technology. In particular, $TP_N^T[i, j]$ (reference numeral 208-1) denotes the parametric data ($TP_N$) obtained for a memory instance having i rows and j columns in target technology, which corresponds to its congruent instance associated with data point 204-1 in the first parametric dataset 202A. Similarly, target memory instances T[i+2Δi, j], T[i, j+2Δj], and T[i+2Δi, j+2Δj] used for populating the second parametric dataset 202B, which are respectively congruent with source instances S[i+2Δi, j], S[i, j+2Δj], and S[i+2Δi, j+2Δj] of the first parametric dataset 202A, give rise to data points $TP_N^T[i+2\Delta i, j]$ (reference numeral 208-3), $TP_N^S[i, j+2\Delta j]$ (reference numeral 208-2), and $TP_N^S[i+2\Delta i, j+2\Delta j]$ (reference numeral 208-4), respectively.

Analogous to the first exemplary characterization scheme, parametric scale factors are determined for a select number of data points associated with respective congruent memory instances of the first and second datasets 202A, 202B, which are used for obtaining an interpolated scale factor. In the exemplary embodiment of the present invention shown in FIG. 2, reference numerals 210-A through 210-D diagrammatically illustrate four scale factor relationships A–D, respectively, which are obtained as ratios of the four respective pairs of data points. Specifically, scale factor A is determined as the ratio between $TP_N^S[i, j]$ and $TP_N^T[i, j]$, which correspond to the congruent pair S[i, j] and T[i, j]. The remaining scale factors B–D are obtained in similar fashion. Reference numeral 210-E refers to an interpolated parametric scale factor that is based on the four absolute ratios, i.e., scale factors A–D above. Again, a 4-point interpolation technique may preferably be utilized for this purpose. The sparsely sampled parametric dataset 202B is thereafter populated by deriving the estimated parametric values for additional target technology memory compilers, wherein the interpolated scale factor is applied to the data points of the first parametric dataset 202A on a congruent pair basis. Reference numeral 212 refers to the derived data point $DTP_N^T[i+\Delta i, j+\Delta j]$ based on the application of E in conjunction with the data point associated with the congruent source instance $S[i+\Delta i, j+\Delta j]$.

It should again be apparent that the same interpolated parametric scale factor E may be used for deriving parametric data for all target technology compilers bounded in the region defined by [i, j], [i, j+2Δj], [i+2Δi, j] and [i+2Δi, j+2Δj]. Another set of absolute ratios (A', B', C', and D') may be determined for congruent memory instances outside this region, which ratios may be used for interpolating another estimated scale factor E'. This new estimated scale factor E' may then be used for deriving the parametric data for the compilers in that congruent region. Once again, favorable results have been obtained by implementing this exemplary memory compiler characterization scheme with respect to several memory timing parameters, where the timing data is scaled from the source dataset to a sparse target dataset.

Figure 3:
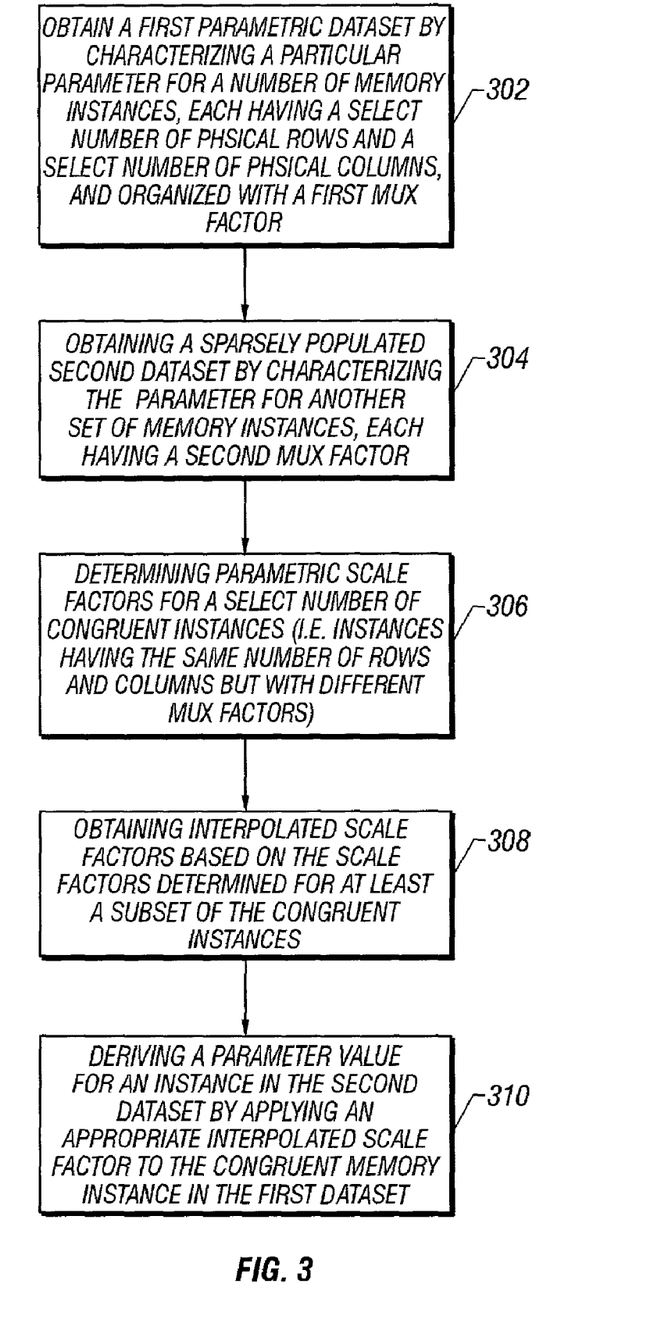
FIG. 3 is a flow chart of the steps involved in the first exemplary embodiment of the memory compiler characterization scheme of the present invention.

Referring now to FIG. 3, depicted therein is a flow chart of the steps involved in the first exemplary embodiment of the memory compiler characterization scheme of the present invention, wherein parametric scaling between compiler populations of two different MUX factors is utilized for estimating data in a sparsely characterized dataset. As set forth above with respect to FIG. 1, a first parametric dataset which is relatively rigorously characterized is obtained by simulating a particular parameter (e.g., a timing parameter) for a number of memory instances organized with a first MUX factor (step 302). A sparsely populated second parametric dataset is obtained by coarse sampling, wherein another set of memory instances having a second MUX factor is characterized (step 304). Parametric scale factors are determined for a select number of congruent memory instances (step 306), wherein instances in the congruent pair have the same numbers of physical rows and physical columns but are organized with different MUX factors.

Thereafter, one or more interpolated scale factors are obtained (step 308) based on the absolute scale factors determined in step 306. As alluded to in the foregoing, a 4-point interpolation is used in a presently preferred exemplary implementation of the present invention for interpolating an estimated scale factor for a region bounded by four congruent pairs for which the absolute scale factors are known. Parametric data for additional compilers of the sparsely characterized dataset may subsequently be derived by applying the interpolated scale factor in conjunction with the data obtained for the bounded congruent memory compilers that are rigorously characterized (step 310).

Figure 4:
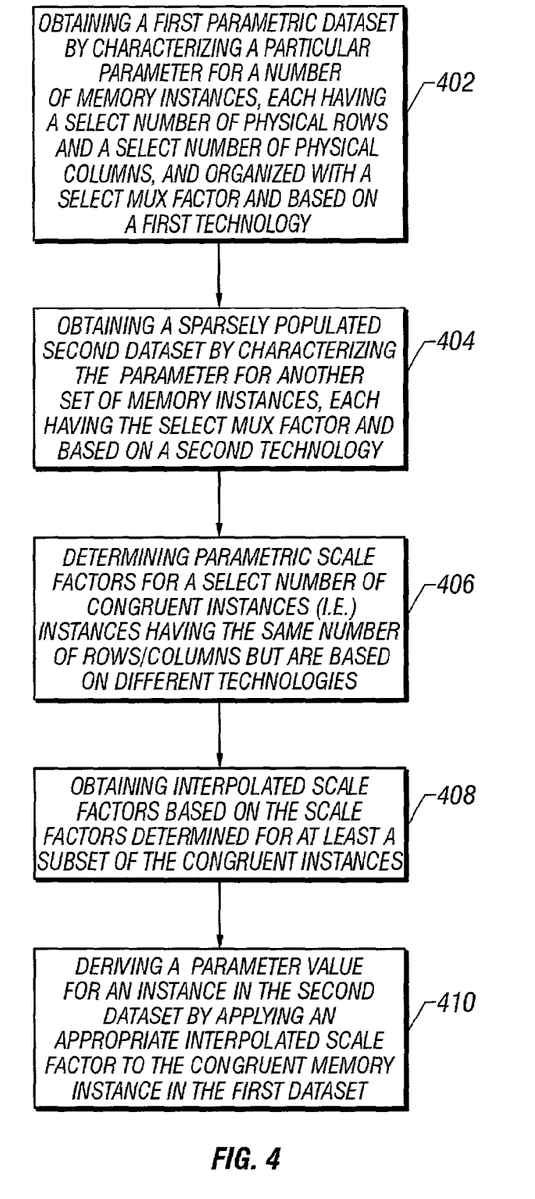
FIG. 4 is a flow chart of the steps involved in the second exemplary embodiment of the memory compiler characterization scheme of the present invention.

FIG. 4 is a flow chart of the steps involved in the second exemplary embodiment of the memory compiler characterization scheme of the present invention, wherein parametric scaling between compiler populations of two different technology variants is utilized for estimating data in a sparsely characterized dataset. Similar to the flow chart described hereinabove, a first parametric dataset which is relatively rigorously characterized is obtained by simulating a particular parameter for a number of memory instances whose compilers are operable with a first technology (i.e., source technology) (step 402). Again, a sparsely populated second parametric dataset is obtained by coarse sampling, wherein another set of memory instances from a second technology (i.e., target technology) is characterized (step 404). Parametric scale factors are determined for a select number of congruent memory instances (step 406), wherein instances in the congruent pair have the same numbers of physical rows and physical columns that are organized with the same MUX factor, but belong to two different technology variants. For instance, the source technology may be 0.2μ technology, whereas the target technology may comprise feature sizes of 0.15μ. Or, in a further exemplary implementation, the source technology may comprise a first foundry where the memory is fabricated. The target technology in that case comprises a second foundry for the memory fabrication.

One or more interpolated scale factors are subsequently obtained (step 408) based on the absolute scale factors determined in step 406. As alluded to in the foregoing, a 4-point interpolation may also be used in this exemplary embodiment of the present invention for interpolating an estimated scale factor. Again, four absolute scale factors associated with a bounded region may be utilized for interpolation. Parametric data for additional compilers of the sparsely characterized dataset in the target technology are derived by applying the interpolated scale factor in conjunction with the data obtained for the congruent memory compilers (step 410).

Figure 5:
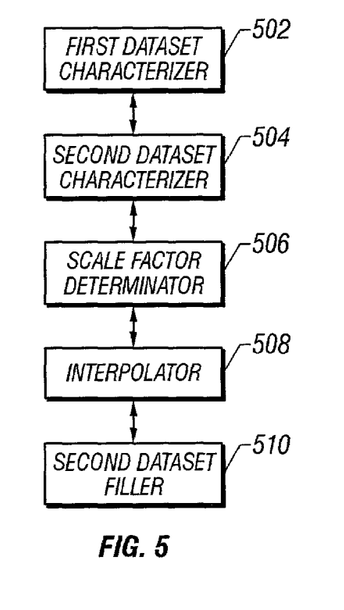
FIG. 5 depicts an exemplary embodiment of the memory compiler characterization system of the present invention.

Referring now to FIG. 5, depicted therein is an exemplary embodiment of the memory compiler characterization system of the present invention, which system may be implemented as a software system, firmware system, hardware system, computer-accessible medium system, or as a combination thereof. A first dataset characterizer 502 is operable for characterizing a first plurality of memory compilers associated with memory instances of a first type, i.e., a first MUX factor, source technology, etc. A second dataset characterizer 504 is preferably operable for characterizing a second plurality of congruent memory compilers associated with memory instances of a second type, i.e., a second MUX factor, target technology, etc. Preferably, dataset characterizers 502, 504 may comprise a subsystem operable to run software tools such as a SPICE simulator to simulate various delay parametrics. A scale factor determinator 506 is operable for determining absolute scale factors between the parametric values of selected congruent memory compilers. An interpolator 508 is operable for obtaining an interpolated scale factor based on the absolute scale factors. A dataset filler 510 is operable to populate the sparsely characterized dataset (i.e., the second dataset) by applying the interpolated scale factors in conjunction with the parametric data for the congruent memory instances of the first dataset.

Based on the foregoing, it should be appreciated that the present invention provides an innovative solution that advantageously overcomes the various shortcomings and deficiencies of the state-of-the-art memory compiler characterization schemes set forth in the Background section of the present patent application. By employing a coarse sampling technique to sample fewer memory instances for actual simulation and estimating the data for the remainder of the memory instance universe (be it a different MUX factor or a different technology variant), the number of data points needed to generate parametric data of high accuracy is significantly reduced. This reduction results in lesser burden on system requirements (i.e., computer hardware and software capabilities required for simulating the numerous memory clusters to achieve an acceptable level of accuracy, for example, 2–3%), which further gives rise to faster turnaround times for compiler design.

It is believed that the operation and construction of the present invention will be apparent from the foregoing Detailed Description. While the method and system shown and described have been characterized as being preferred, it should be readily understood that various changes and modifications could be made therein without departing from the scope of the present invention as set forth in the following claims.

What is claimed is:

1. A memory compiler characterization method for determining parametric data associated with compilable memory instances, comprising:

obtaining a first parametric dataset associated with a first plurality of memory compilers, said memory compilers for compiling a first set of memory instances, each instance having a select number of physical rows and a select number of physical columns, wherein each memory instance is organized using a first MUX factor and further wherein a data point in said first parametric dataset corresponds to a value with respect to a particular parameter characterized for a memory instance sampled from said first set of memory instances;

obtaining a second parametric dataset by characterizing said particular parameter for a second set of memory instances that are compiled by a second plurality of memory compilers, each of said second plurality of memory compilers for compiling a respective memory instance organized with a second MUX factor, wherein said second plurality of memory compilers are sparsely sampled from said first plurality of memory compilers such that each memory instance compiled by said second plurality of memory compilers corresponds to a respective congruent memory instance of said first parametric dataset having identical numbers of physical rows and physical columns, and said second plurality of memory compilers comprises a subset of said first plurality of memory compilers.

determining scale factors for a select number of parametric data points associated with respective congruent memory instances of said first and second parametric datasets;

obtaining an interpolated scale factor based on said scale factors; and deriving a value of said particular parameter for an additional memory instance having said second MUX factor by applying said interpolated scale factor to a data point associated with a memory instance having said first MUX factor, wherein said memory instance with said first MUX factor is congruent with respect to said additional memory instance with said second MUX factor.

2. The memory compiler characterization method for determining parametric data associated with compilable memory instances as set forth in claim 1, wherein said particular parameter comprises a memory timing parameter.

3. The memory compiler characterization method for determining parametric data associated with compilable memory instances as set forth in claim 2, wherein said memory timing parameter comprises memory access time.

4. The memory compiler characterization method for determining parametric data associated with compilable memory instances as set forth in claim 2, wherein said memory timing parameter comprises memory cycle time.

5. The memory compiler characterization method for determining parametric data associated with compilable memory instances as set forth in claim 1, wherein said first MUX factor is selected from at least one of a MUX-4 factor, a MUX-8 factor, a MUX-16 factor and a MUX-32 factor.

6. The memory compiler characterization method for determining parametric data associated with compilable memory instances as set forth in claim 1, wherein said second MUX factor is selected from at least one of a MUX-4 factor, a MUX-8 factor, a MUX-16 factor and a MUX-32 factor.

7. The memory compiler characterization method for determining parametric data associated with compilable memory instances as set forth in claim 1, wherein each memory instance of said first and second sets of memory instances comprises one of a read-only memory (ROM) circuit, a static random access memory (SRAM) circuit, a dynamic random access memory (DRAM) circuit, an electrically programmable ROM (EPROM) circuit, a flash memory circuit, an embedded memory circuit, and a stand-alone memory circuit.

8. The memory compiler characterization method for determining parametric data associated with compilable memory instances as set forth in claim 1, wherein said interpolated scale factor is obtained by interpolating four scale factors, each corresponding to a ratio of values of said particular parameter for a pair of congruent memory instances.

9. The memory compiler characterization method for determining parametric data associated with compilable memory instances as set forth in claim 1, wherein said first and second parametric datasets are obtained by characterization of said particular parameter via simulation.

10. A memory compiler characterization method for determining parametric data associated with compilable memory instances, comprising:

obtaining a first parametric dataset associated with a first plurality of memory compilers representative of a first memory technology, said memory compilers for compiling a first set of memory instances, each instance having a select number of physical rows and a select number of physical columns and organized using a select MUX factor, wherein a data point in said first parametric dataset corresponds to a value with respect to a particular parameter characterized for a memory instance sampled from said first set of memory instances;

obtaining a second parametric dataset by characterizing said particular parameter for a second set of memory instances compiled by a second plurality of memory compilers that are representative of a second memory technology, each of said second plurality of memory compilers for compiling a respective memory instance organized with said select MUX factor, wherein said second plurality of memory compilers are sparsely sampled from said first plurality of memory compilers such that each memory instance compiled by said second plurality of memory compilers corresponds to a respective congruent memory instance of said first parametric dataset having identical numbers of physical rows and physical columns, and said second plurality of memory compilers comprises a subset of said first plurality of memory compilers.

determining scale factors for a select number of parametric data points associated with respective congruent memory instances of said first and second parametric datasets;

obtaining an interpolated scale factor based on said scale factors; and deriving a value of said particular parameter for an additional memory instance of said second memory technology by applying said interpolated scale factor to a data point associated with a memory instance of said first memory technology, wherein said memory instance of said first memory technology is congruent with respect to said additional memory instance of said second memory technology.

11. The memory compiler characterization method for determining parametric data associated with compilable memory instances as set forth in claim 10, wherein said particular parameter comprises a memory timing parameter.

12. The memory compiler characterization method for determining parametric data associated with compilable memory instances as set forth in claim 11, wherein said memory timing parameter comprises memory access time.

13. The memory compiler characterization method for determining parametric data associated with compilable memory instances as set forth in claim 11, wherein said memory timing parameter comprises memory cycle time.

14. The memory compiler characterization method for determining parametric data associated with compilable memory instances as set forth in claim 10, wherein said select MUX factor is selected from at least one of a MUX-4 factor, a MUX-8 factor, a MUX-16 factor and a MUX-32 factor.

15. The memory compiler characterization method for determining parametric data associated with compilable memory instances as set forth in claim 10, wherein each memory instance of said first and second sets of memory instances comprises one of a read-only memory (ROM) circuit, a static random access memory (SRAM) circuit, a dynamic random access memory (DRAM) circuit, an electrically programmable ROM (EPROM) circuit, a flash memory circuit, an embedded memory circuit, and a stand-alone memory circuit.

16. The memory compiler characterization method for determining parametric data associated with compilable memory instances as set forth in claim 10, wherein said interpolated scale factor is obtained by interpolating four scale factors, each corresponding to a ratio of values of said particular parameter for a pair of congruent memory instances.

17. The memory compiler characterization method for determining parametric data associated with compilable memory instances as set forth in claim 10, wherein said first and second parametric datasets are obtained by characterization of said particular parameter via simulation.

18. The memory compiler characterization method for determining parametric data associated with compilable memory instances as set forth in claim 10, wherein said first memory technology is selected from at least one of 1.0μ technology, 0.8μ technology, 0.6μ technology and 0.2μ technology.

19. The memory compiler characterization method for determining parametric data associated with compilable memory instances as set forth in claim 10, wherein said second memory technology is selected from at least one of 1.0μ technology, 0.8μ technology, 0.6μ technology and 0.2μ technology.

20. The memory compiler characterization method for determining parametric data associated with compilable memory instances as set forth in claim 10, wherein said first and second memory technologies comprise design-rule-specific technologies.

21. The memory compiler characterization method for determining parametric data associated with compilable memory instances as set forth in claim 10, wherein said first and second memory technologies comprise foundry-specific technologies.

22. The memory compiler characterization method for determining parametric data associated with compilable memory instances as set forth in claim 10, wherein said first and second memory technologies comprise process-flow-specific technologies.

23. A memory compiler characterization system, comprising:

means for characterizing a first plurality of memory compilers with respect to a particular parameter, said first plurality of memory compilers for compiling memory instances of a first type;

means for characterizing a second plurality of memory compilers with respect to said particular parameter, said second plurality of memory compilers for compiling memory instances of a second type, wherein said memory instances of second type comprise memory instances sparsely sampled from said memory instances of first type such that each sampled memory instance of second type corresponds to a respective congruent memory instance of first type having identical numbers of physical rows and physical columns, and said second type of memory instances comprises a subset of said first type of memory instances;

means for determining scale factors between values of said particular parameter respectively associated with a pair of congruent memory instances of said first and second types;

an interpolator to obtain an interpolated scale factor based on said scale factors; and means for obtaining a value of said particular parameter for an additional memory instance of second type by utilizing said interpolated scale factor in conjunction with a parametric value of a congruent memory instance of first type which corresponds to said additional memory instance.

24. The memory compiler characterization system as set forth in claim 23, wherein said memory instances of first type comprise memory instances with a first MUX factor and said memory instances of second type comprise memory instances with a second MUX factor.

25. The memory compiler characterization system as set forth in claim 24, wherein said first MUX factor is selected from at least one of a MUX-4 factor, a MUX-8 factor, a MUX-16 factor and a MUX-32 factor.

26. The memory compiler characterization system as set forth in claim 24, wherein said second MUX factor is selected from at least one of a MUX-4 factor, a MUX-8 factor, a MUX-16 factor and a MUX-32 factor.

27. The memory compiler characterization system as set forth in claim 23, wherein said memory instances of first type comprise memory instances associated with a first memory technology and said memory instances of second type comprise memory instances associated with a second memory technology.

28. The memory compiler characterization system as set forth in claim 27, wherein said first memory technology is selected from at least one of 1.0μ technology, 0.8μ technology, 0.6μ technology and 0.2μ technology.

29. The memory compiler characterization system as set forth in claim 27, wherein said second memory technology is selected from at least one of 1.0μ technology, 0.8μ technology, 0.6μ technology and 0.2μ technology.

30. The memory compiler characterization system as set forth in claim 27, wherein said first and second memory technologies comprise design-rule-specific technologies.

31. The memory compiler characterization system as set forth in claim 27, wherein said first and second memory technologies comprise process-flow-specific technologies.

32. The memory compiler characterization system as set forth in claim 27, wherein said first and second memory technologies comprise foundry-specific technologies.

33. The memory compiler characterization system as set forth in claim 23, wherein said memory instances comprise one of a DRAM circuit, an SRAM circuit, a ROM circuit, an EPROM circuit and a flash memory circuit.

* * * * *

UNITED STATES PATENT AND TRADEMARK OFFICE
CERTIFICATE OF CORRECTION

PATENT NO.          : 7,197,438 B1                                   Page 1 of 1
APPLICATION NO. : 09/981954
DATED               : March 27, 2007
INVENTOR(S)         : Mehta et al.

It is certified that error appears in the above-identified patent and that said Letters Patent is hereby corrected as shown below:

The Face

Under the (75) Inventors designation, "Raymond Tak-Hoi" should read -- Raymond Tak-Hoi Leung --

Signed and Sealed this

Fifteenth Day of May, 2007

JON W. DUDAS
*Director of the United States Patent and Trademark Office*